United States Patent [19]

Hine

[11] Patent Number: 4,547,231
[45] Date of Patent: Oct. 15, 1985

[54] METHOD OF MANUFACTURING SEMICONDUCTOR DEVICE UTILIZING SELECTIVE EPITAXIAL GROWTH UNDER REDUCED PRESSURE

[75] Inventor: Shiro Hine, Itami, Japan

[73] Assignee: Mitsubishi Denki Kabushiki Kaisha, Tokyo, Japan

[21] Appl. No.: 625,783

[22] Filed: Jun. 26, 1984

[30] Foreign Application Priority Data

Jul. 8, 1983 [JP] Japan ................. 58-125237

[51] Int. Cl.$^4$ .................. H01L 21/205; H01L 21/76
[52] U.S. Cl. ................... 148/175; 29/576 E; 29/576 W; 29/578; 148/DIG. 26; 148/DIG. 50; 156/612; 357/50
[58] Field of Search ............ 29/576 W, 576 E, 578; 148/175; 156/612; 357/50

[56] References Cited

U.S. PATENT DOCUMENTS

| | | | |
|---|---|---|---|
| 3,206,339 | 9/1965 | Thornton | 148/175 |
| 3,265,542 | 8/1966 | Hirshon | 148/175 |
| 3,421,055 | 1/1969 | Bean et al. | 148/175 X |
| 3,661,636 | 5/1972 | Green et al. | 148/175 X |

OTHER PUBLICATIONS

Sirtl et al., "Selective Epitaxy of Silicon . . . " Semiconductor Silicon (Text) New York, Electrochem. Soc., May 1969, pp. 169–188.
Silvestri et al., "Ge Epitaxial Refill Deposition . . . Structures" IBM J. Res. Develop., Jan. 1972, pp. 71–75.
Silvestri et al., "Growth Mechanism . . . Near SiO$_2$-Ge Boundary" J. Electrochem. Soc., Feb. 1972, vol. 119, No. 2, pp. 245–250.
Endo et al., "Novel Device Isolation . . . Selective Epitaxial Growth" I.E.D.M., Dec. 1982, pp. 241–244.

Primary Examiner—William G. Saba
Attorney, Agent, or Firm—Lowe, King, Price & Becker

[57] ABSTRACT

Semiconductor layers are selectively epitaxially grown in portions having an insulating film removed which is formed on a substrate by selective epitaxial growth under reduced pressure. With respect to a circumferential region outwardly of the removed portions in which the semiconductor elements are to be provided, there are formed one or more removed portions (dummy portions) in which no semiconductor element is provided, thereby making arrangement of the removed portions as even as possible with respect to the entire surface of the insulating film, to overcome position dependency in flatness of the semiconductor layers to be obtained. The semiconductor layers grown in the dummy portions may be left not to have semiconductor elements formed therein.

4 Claims, 5 Drawing Figures 4,547,231

METHOD OF MANUFACTURING SEMICONDUCTOR DEVICE UTILIZING SELECTIVE EPITAXIAL GROWTH UNDER REDUCED PRESSURE

BACKGROUND OF THE INVENTION

1. Field of the Invention

The present invention relates to a method of manufacturing a semiconductor device in which a plurality of semiconductor elements are arranged and, more particularly, it relates to a method of separating semiconductor elements.

2. Description of the Prior Art

In general, separation between semiconductor elements in such a semiconductor device was performed by a selective oxidation process. However, in such a process, there inevitably arose intrusion of an oxide film into active regions, i.e., so-called bird's beak, and unevenness of the surface caused by swelling of the circumferential portion of the oxide film, i.e., so-called bird's head. The former restricted high density integration of the semiconductor device, while the latter caused inconvenience in multilayer interconnection for the high density integration.

To avoid these disadvantages, a selective epitaxial growth process has been proposed for use in forming such a semiconductor device, in which an insulating layer formed on a substrate is selectively removed and a semiconductor layer is then selectively epitaxially grown on the removed portions. However, the semiconductor layer obtained through the epitaxial growth process also has the disadvantage of unevenness of the surface similar to the oxide film obtained by the selective oxidation process.

In order to overcome the aforementioned disadvantages of the prior art, a method of manufacturing a semiconductor device was proposed in which flatness of the semiconductor device comprising a plurality of semiconductor elements is improved, thereby enabling further effective high density integration. More specifically, according to the proposed method, portions of an insulating film formed on a substrate are selectively removed, whereafter flatness of semiconductor layers on the removed portions, which has not been obtained by conventional selective epitaxial growth under atmospheric pressure, is readily realized by selective epitaxial growth under reduced pressure. Selectivity for epitaxial growth is also improved by the above proposed process, so that the growth of semiconductor on the insulating film is effectively reduced. The selective silicon epitaxy at low pressure for providing good selectivity and flatness is described by S. Hine et al in the proceedings of the Fall Meeting of Japan Society of Applied Physics, October, 1981, page 747. Semiconductor elements are formed in the semiconductor layers thus obtained. However, it was observed that there is still room for improvement of the flatness and selectivity of the semiconductor layers obtained by the selective epitaxial growth under reduced pressure.

SUMMARY OF THE INVENTION

Accordingly, a principal object of the present invention is to facilitate improvement of the flatness and the selectivity of the semiconductor layers obtained by the selective epitaxial growth under reduced pressure.

According to the present invention, portions of the insulating film other than those corresponding to regions for forming the semiconductor elements are also selectively removed so as to be as even as possible as a whole, thereby simultaneously forming semiconductor layers also on the above described removed portions by the selective epitaxial growth under reduced pressure. As a result, better flatness and selectivity are provided in the selective silicon epitaxy under reduced pressure.

The aforedescribed object and other objects, features, aspects and advantages of the present invention will become more apparent from the following detailed description of the present invention when taken in conjunction with the accompanying drawings.

DESCRIPTION OF THE PREFERRED EMBODIMENTS

The background of the present invention is now described in detail, in comparison with a conventional method, with reference to the accompanying drawings.

Figure 1A:
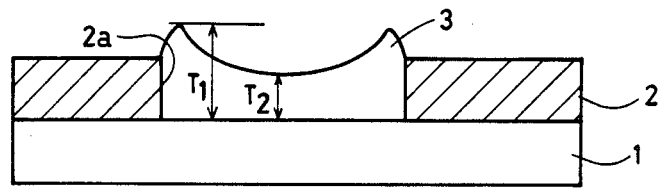
FIGS. 1A and 1B are cross-sectional views showing typical examples of the prior art semiconductor layers obtained by selective epitaxial growth under atmospheric pressure and reduced pressure, respectively.
Figure 1B:
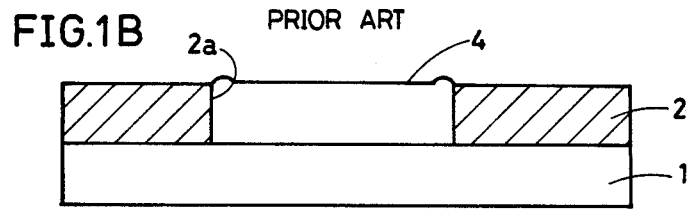

FIG. 1A shows a cross section of a semiconductor layer obtained by conventional selective epitaxial growth under atmospheric pressure and FIG. 1B shows a cross section of a semiconductor layer obtained by selective epitaxial growth under reduced pressure according to the background of the present invention. In the drawings, an insulating film 2 is formed on a substrate 1 and has a removed portion 2a obtained by selective removing of the insulating film 2. Semiconductor layers 3 and 4 are grown in the removed portions 2a.

Figure 2:
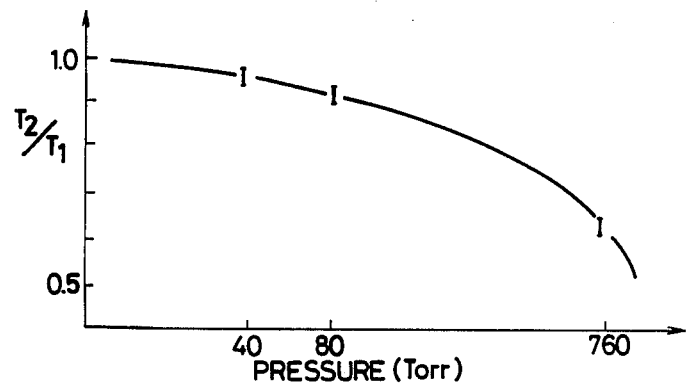
FIG. 2 is an explanatory diagram showing a relation between pressure and layer thickness in epitaxial growth.

In FIG. 2, there is shown the ratio of thickness $T_1$ in an end portion to thickness $T_2$ in an intermediate portion of the semiconductor layer 3 obtained by the conventional selective epitaxial growth under atmospheric pressure, that is, dependency of the thickness ratio $T_2/T_1$ on the pressure in the selective epitaxial growth. As clearly seen from FIG. 2, the pressure obviously functions as a factor to influence flatness, and it is also clear that satisfactory flatness is obtained if the selective epitaxial growth is carried out under reduced pressure at least below 100 Torr. Under reduced pressure, selectivity for epitaxial growth is also improved so that the growth of semiconductor on the insulating film, which results in unevenness of the semiconductor layer, is effectively reduced.

Now that the background of the present invention was described, the present invention is described. According to the present invention, it has been experimentally confirmed that another factor influencing the flatness is an arrangement of the removed portions obtained by selective removal of an insulating film with respect to the entire surface thereof.

Figure 3A:
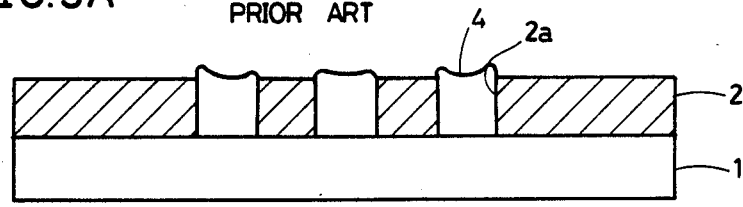
FIGS. 3A and 3B are cross-sectional views typically showing position dependency in arrangement of removed portions of an insulating film and thickness of epitaxially grown semiconductor layers.

More specifically, as typically shown in FIG. 3A, when the selectively removed portions 2a are gathered in the intermediate region of the insulating film 2 which has a relatively wide area as a whole to an extent, semiconductor layers grown in the removed portions 2a defined in the intermediate region become of a smaller thickness than that of the semiconductor layers grown in the removed portions 2a defined in the circumferential region, even if the selective epitaxial growth is carried out under reduced pressure.

Such a tendency is particularly noticeable in the conventional selective epitaxial growth under atmospheric pressure. This tendency remains in the selective epitaxial growth under reduced pressure according to the background of the present invention, although the degree of unevenness in thickness is improved. Thus, unevenness might be caused in characteristics of semiconductor elements respectively formed in the grown semiconductor layers.

Figure 3B:
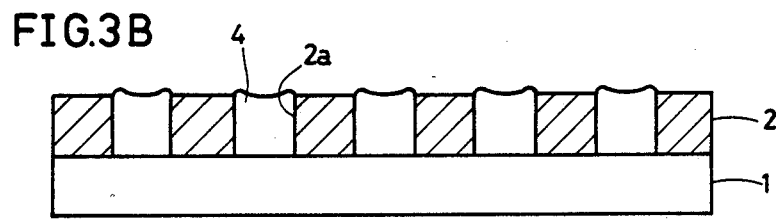

Therefore, according to the present invention, in addition to regions in which the semiconductor elements are to be provided, the removed portions 2a are formed in regions in which the semiconductor elements are not to be formed as shown in FIG. 3B, such that the removed portions 2a are arranged in a dispersed fashion as even as possible, whereafter semiconductor layers are epitaxially grown selectively under reduced pressure simultaneously in the respective removed portions 2a regardless of formation of semiconductor elements.

In other words, with respect to the circumferential region outwardly of the removed portions in which the semiconductor elements are to be provided, there are formed one or more removed portions (dummy portions) in which no semiconductor element is provided, thereby making arrangement of the removed portions as even as possible with respect to the entire surface of the insulating film 2, to overcome position dependency in flatness of the semiconductor layers to be obtained. The semiconductor layers grown in the dummy portions may be left not to have semiconductor elements formed therein.

As hereinabove described, according to the present invention, selective epitaxial growth with respect to removed portions selectively defined in an insulating film on a substrate is carried out under reduced pressure and, in defining of the removed portions in the insulating film, the subject portions are arranged as evenly as possible over the entire surface of the insulating film regardless of provision of semiconductor elements. Therefore, flatness and selectivity of semiconductor layers obtained by the epitaxial growth can be effectively improved and position dependency of the grown semiconductor layers can be effectively overcome.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including a plurality of semiconductor elements separated from each other by an insulating film, said method comprising the steps of:

forming an insulating film on a substrate;

selectively defining removed portions with respect to said insulating film, said removed portions comprising first portions in which semiconductor elements are to be provided and second portions in which no semiconductor element is to be provided, said portions being arranged substantially uniformly along said substrate; and locating said second portions circumferentially outwardly of said first portions; and growing semiconductor layers in said removed portions by selective epitaxial growth under reduced pressure, selecting only elements formed in said first portions for use as semiconductors in a circuit.

2. A method of manufacturing a semiconductor device including a plurality of semiconductor elements separated from each other by an insulating film, said method comprising the steps of:

forming an insulating film on a substrate;

selectively defining removed portions with respect to said insulating film, said removed portions comprising first portions in which semiconductor elements are to be provided and second portions in which no semiconductor element is to be provided, said portions being arranged substantially uniformly along said substrate; and locating said second portions circumferentially outwardly of said first portions; and growing semiconductor layers in said removed portions by selective epitaxial growth under reduced pressure, selecting only semiconductors formed in said first portions for connection to wiring layers.

3. A method of manufacturing a semiconductor device in accordance with claim 1, wherein said epitaxial growth is achieved under reduced pressure of below 100 Torr.

4. A method of manufacturing a semiconductor device in accordance with claim 2, wherein said epitaxial growth is achieved under reduced pressure of below 100 Torr.

* * * * *